(12) United States Patent
Ananiev et al.

(10) Patent No.: US 12,406,940 B2
(45) Date of Patent: Sep. 2, 2025

(54) SEMICONDUCTOR CHIP HAVING A CRACK STOP STRUCTURE

(71) Applicant: Infineon Technologies AG, Neubiberg (DE)

(72) Inventors: Sergey Ananiev, Ottobrunn (DE); Andreas Bauer, Regensburg (DE); Michael Goroll, Poing (DE); Maria Heidenblut, Schwarzenfeld (DE); Stefan Kaiser, Aschheim (DE); Gunther Mackh, Neumarkt (DE); Kabula Mutamba, Pentling (DE); Reinhard Pufall, Munich (DE); Georg Reuther, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 303 days.

(21) Appl. No.: 17/582,285

(22) Filed: Jan. 24, 2022

(65) Prior Publication Data
US 2022/0270985 A1    Aug. 25, 2022

(30) Foreign Application Priority Data
Feb. 23, 2021    (DE) .......................... 102021104234.8

(51) Int. Cl.
*H01L 23/00* (2006.01)
(52) U.S. Cl.
CPC ................................. *H01L 23/562* (2013.01)

(58) Field of Classification Search
None
See application file for complete search history.

(56) References Cited

U.S. PATENT DOCUMENTS

| 9,059,167 | B2 | 6/2015 | Farooq et al. |
| 10,504,859 | B2 | 12/2019 | Zhu et al. |
| 2010/0200958 | A1 | 8/2010 | Angyal et al. |
| 2011/0193197 | A1 | 8/2011 | Farooq et al. |
| 2012/0074519 | A1 | 3/2012 | Yeo et al. |
| 2020/0035621 | A1 | 1/2020 | Yang et al. |

OTHER PUBLICATIONS

Midwest Tungsten Service, Tungsten Metal (W) Element Chemical + Physical Properties.*
"Kapitel 2—Theoretische Grundlagen".
Waltrich, Uwe, "Optimierung von Hochspannungsleistungsmodulen für modulare Multilevel-Topologien unter Berücksichtigung von Lebensdaueraspekten", Friedrich-Alexander-Universität Erlangen-Nürnberg (FAU), Apr. 11, 2019.

* cited by examiner

*Primary Examiner* — Bo B Jang
(74) *Attorney, Agent, or Firm* — Murphy, Bilak & Homiller, PLLC (57) ABSTRACT

A semiconductor chip having a crack stop structure is disclosed. The crack stop structure includes one or more recesses formed in the semiconductor chip. The one or more recesses extend adjacent to and along a periphery of the semiconductor chip. The one or more recesses are filled with a metal material. The metal material has an intrinsic tensile stress at room temperature that induces compressive stress in at least a region of the periphery of the semiconductor chip.

13 Claims, 9 Drawing Sheets

SEMICONDUCTOR CHIP HAVING A CRACK STOP STRUCTURE

TECHNICAL FIELD

This disclosure relates to the field of semiconductor chips, and in particular to crack stop structures implemented in semiconductor chips.

BACKGROUND

Sidewalls of semiconductor chips are prone to mechanical damage during and after separating the semiconductor chips from the semiconductor wafer. All singulation methods used in industry (mechanical dicing, laser dicing and their variants) result in significant reduction of the effective chip fracture strength. Strength reduction can amount to values up to ~20 times compared to theoretical fracture strength of e.g. single crystalline silicon or silicon carbide. Therefore, the presence of defects and sub-micron cracks on chip sidewalls after singulation cannot be avoided.

The current approach is to introduce some Crack Stop Structures (CSS) between the chip sidewall (where cracks in most cases start) and the electrically active chip area. Current CSS aim to force the propagating crack to lose as much energy as possible before reaching the electrically active area. In ideal cases the crack stops inside such structure without affecting the electrical functionality of the chip.

This approach relies on energy dissipation during crack propagation and therefore often needs a significant distance between the sidewall of the chip and the CSS. Further, to minimize the loss of semiconductor area caused by the CSS, the electrically active area and the CSS are often located as close as possible to each other resulting in that the material of the CSS is often optimized for electrical performance of the chip, e.g. by using a dielectric material or a metal inducing low stress in the semiconductor lattice.

SUMMARY

According to an aspect of the disclosure a semiconductor chip having a crack stop structure is disclosed. The crack stop structure comprises one or more recesses formed in the semiconductor chip, the one or more recesses extending adjacent to and along a periphery of the semiconductor chip. The one or more recesses are filled with a metal material, and the metal material has an intrinsic tensile stress at room temperature that induces compressive stress in at least a region of the periphery of the semiconductor chip.

According to another aspect of the disclosure a method of manufacturing a semiconductor chip having a crack stop structure comprises forming one or more recesses in the semiconductor chip, the one or more recesses extending adjacent to and along a periphery of the semiconductor chip; and filling the one or more recesses with a metal material in an intrinsic tensile stress state, wherein the intrinsic tensile stress at room temperature of the filled-in metal material induces compressive stress in at least a region of the periphery of the semiconductor chip.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

DETAILED DESCRIPTION

As used in this specification, layers or elements illustrated as adjacent layers or elements do not necessarily be directly contacted together; intervening elements or layers may be provided between such layers or elements. However, in accordance with the disclosure, elements or layers illustrated as adjacent layers or elements may in particular be directly contacted together, i.e. no intervening elements or layers are provided between these layers or elements, respectively.

The words "over" or "beneath" with regard to a part, element or material layer formed or located or disposed or arranged or placed "over" or "beneath" a surface may be used herein to mean that the part, element or material layer be located (e.g. placed, formed, arranged, disposed, placed, etc.) "directly on" or "directly under", e.g. in direct contact with, the implied surface. The word "over" or "beneath" used with regard to a part, element or material layer formed or located or disposed or arranged or placed "over" or "beneath" a surface may, however, either be used herein to mean that the part, element or material layer be located (e.g. placed, formed, arranged, deposited, etc.) "indirectly on" or "indirectly under" the implied surface, with one or more additional parts, elements or layers being arranged between the implied surface and the part, element or material layer.

Figure 1:
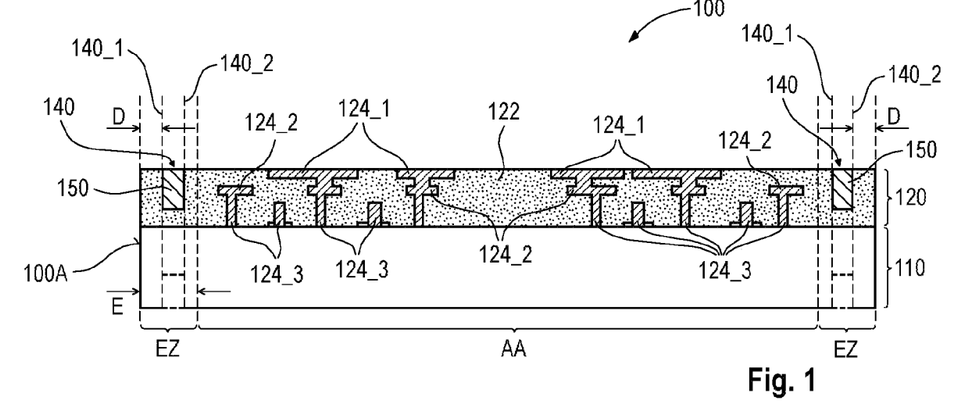
FIG. 1 is a schematic cross-sectional view of an exemplary semiconductor chip having a crack stop structure (CSS).

FIG. 1 illustrates an exemplary semiconductor chip 100 having a crack stop structure (CSS). The semiconductor chip 100 may include a semiconductor substrate 110 and an electrical interconnect structure 120. The electrical interconnect structure 120 is disposed over the semiconductor substrate 110. The semiconductor substrate 110 typically includes monolithically integrated semiconductor devices such as, e.g., transistors, diodes, resistors, capacitors, inductors or other integrated devices (not shown).

The semiconductor substrate 110 may be fabricated from specific semiconductor material(s), for example Si, SiC, SiGe, Ge, GaN, GaAs, InAs, etc. and other III-V and II-VI compound semiconductors. In particular, the semiconductor substrate 110 may be made of a WBG (Wide Bandgap) semiconductor material such as, e.g., SiC, GaN, and III-V and II-VI compound semiconductors having a wide bandgap.

The electrical interconnect structure 120 may be formed of one or a plurality of insulating layers 122 and one or a plurality of electrically conductive layers 124_1, 124_2. The electrically conductive layers 124_1, 124_2 may be structured to form an electrical interconnect metallization which provides electrical connection between the semiconductor devices (not shown) in the semiconductor substrate 110 and contact pads (e.g. formed by the structured electrically conductive layer 124_1) at the top side of the semiconductor chip 100. Electrical through-connections (vias) 124_3 may serve to electrically connect between electrically conductive layers 124_1, 124_2 and the integrated devices (not shown) implemented in the semiconductor substrate 110.

Typically, the integrated devices (not shown) of the semiconductor substrate 110 are formed during front-end-of-line (FEOL) processing while the electrical interconnect (e.g. electrically conductive layers 124_1, 124_2 and electrical through-connections 124_3) are embedded in the one or more insulating layers 122 during back-end-of-line (BEOL) processing.

The insulating layer(s) 122 may include one or more dielectric material layers, which may have different compositions. For instance, the insulating layer(s) may include or be of silicon oxide, silicon nitride or other hard passivation materials.

The semiconductor chip 100 includes a crack stop structure (CSS) 140. The CSS 140 comprises one or more recesses 150 formed in the semiconductor chip 100. The one or more recesses 150 extend adjacent to and along a periphery (sidewall) of the semiconductor chip 100. The one or more recesses 150 may, e.g., extend in a direction perpendicular to the main surfaces of the semiconductor chip 100. In one example the one or more recesses 150 may end in depth direction (e.g. vertical direction) within the electrical interconnect structure 120. In other examples at least some of the one or more recesses 150 pass through the electrical interconnect structure 120 (i.e. through the layer stack of at least one insulating layer 122 and at least one metal layer 124_1, 124_2) and may extend into the semiconductor substrate 110. In still other examples, at least some of the one or more recesses 150 pass through the semiconductor substrate 110, i.e. pass through the entire semiconductor chip 100.

The CSS 140 are located outside an electrically active chip area AA in an edge zone EZ of the semiconductor chip 100. The edge zone EZ extends between the periphery 100A of the semiconductor chip 100 and the active area AA of the semiconductor chip 100. As illustrated in FIG. 1, a distance between the periphery 100A of the semiconductor chip 100 and an outer circumferential contour line 140_1 of the CSS 140 is denoted by D and the lateral extension of the edge zone EZ is denoted by E.

According to the disclosure the one or more recesses 150 of the CSS 140 are filled with a metal material, wherein the metal material has an intrinsic tensile stress at room temperature high enough to induce compressive stress in at least a region of the periphery 100A of the semiconductor chip 100. As will be explained in more detail further below, the compressive stress induced at the periphery 100A of the semiconductor chip 100 counteracts the formation and/or growth of chip cracks at the periphery (sidewall) 100A of the semiconductor chip 100. Differently put, at least a region or, e.g., the entire periphery 100A of the semiconductor chip 100 is biased in a compressive stress state induced by the CSS or, more specifically, by the intrinsic tensile stress of the metal material used for filling the recess(es) 150 of the CSS 140.

Generally, the higher the intrinsic tensile stress of the CSS metal at room temperature, the greater is the compressive stress induced at the periphery 100A of the semiconductor chip 100. Further, the smaller the distance D, the higher is the compressive stress obtained at the periphery 100A of the semiconductor chip 100 for a given intrinsic tensile stress of the metal material. For instance, the intrinsic tensile stress at room temperature of the metal material may be equal to or greater than 200 MPa or 300 MPa or 500 MPa or 700 MPa or 900 MPa or 1.0 GPa or 1.2 GPa or 1.5 GPa or 2.0 GPa or 2.5 GPa. The distance D between the periphery 100A of the semiconductor chip 100 and the outer circumferential contour line 140_1 of the CSS may, e.g., be equal to or less than 25 μm or 20 μm or 15 μm or 10 μm or 5 μm or 3 μm.

According to the disclosure it has been found that forcing the periphery 100A of the semiconductor chip 100 into a pre-stressed state (of negative sign, i.e. compressive stress) makes CSS much more effective because it will prevent cracks from forming and/or growing. Differently put, external loading, as, e.g., exerted by wafer dicing, has first to overcome the additional compressive stress at the periphery 100A of the semiconductor chip 100 induced by the relatively high intrinsic tensile stress of the metal material in the recess(es) 150 of the CSS 140.

The operating principle of this concept is similar to the well-known approach of using reinforcement steel in reinforced concrete. The basic idea of reinforced concrete (also known as pre-stressed concrete) is to pre-stress the concrete structure against external loading by integrating reinforcement steel in the concrete. In analogy to reinforced concrete, the metal material of relatively high intrinsic tensile stress pre-stresses the periphery 100A of the semiconductor chip 100 into a compressive stress state which counteracts and thereby reduces the cracking risk.

In contrast, the conventional CSS approach is to provide for a substantial distance D to allow the propagating crack to lose as much energy as possible before reaching the CSS for stopping the crack. Such conventional CSS often uses a dielectric material or a metal material of specifically low intrinsic tensile stress in order to affect as little as possible the electrical functionality of the semiconductor chip 100 (i.e. the functionality of semiconductor devices monolithically integrated within the electrically active chip area AA of the semiconductor substrate 110).

According to the disclosure, metal material is used for the CSS 140 which can be deposited in the recess(es) 150 in a relatively high intrinsic tensile stress state. As explained, this intrinsic tensile stress then induces the required compressive stress at the periphery 100A of the semiconductor chip 100.

Further, the metal material may provide for a high yield stress and/or for a high creep resistance. A high yield stress will assure that the intrinsic tensile stress will not change sign (i.e. will not transform from tensile stress into compressive stress) during device operation. For instance, copper is not a suitable material because plastic deformation begins at a quite low temperature of about 100° C. and leads to change of sign from tensile stress (positive sign) into compressive stress (negative sign). Further, a high creep resistance will assure that the high tensile stress will not be lost during device lifetime. Therefore, chemically highly stable metal materials which can be deposited with high intrinsic tensile stress in the recess(es) and provide for relatively high yield stress and/or relatively high creep resistance are suitable candidates for the CSS metal in accordance with the disclosure.

For instance, the metal material of the CSS 140 may comprise or be tungsten (W) or tungsten titanium alloy (WTi) or nickel (Ni) or nickel vanadium alloy (NiV). These materials, inter alia, can be deposited in a high intrinsic tensile stress state in the CSS recess(es) and provide for appropriate mechanical properties in terms of yield stress and creep resistance.

In particular for W and WTi alloy, deposition conditions as exemplarily specified further below may create intrinsic tensile stress at room temperature equal to or greater than 1.2 GPa or 1.4 GPa or even more.

In particular for Ni and NiV alloy, deposition conditions as exemplarily specified further below may create intrinsic tensile stress at room temperature equal to or greater than 1.1 GPa.

CSS metal intrinsic stress induces compressive stress at the chip periphery (sidewall). The compressive stress at a region of the periphery 100A or the entire periphery 100A of the semiconductor chip 100 may, e.g., be equal to or less than −25 MPa or −50 MPa or −75 MPa or −100 MPa or −200 MPa (note that the smaller (the more negative) the value of compressive stress, the higher is the amount of compressive stress).

Further, the distance D between the periphery 100A of the semiconductor chip 100 and the CSS 140 (or, more specifically, the outer circumferential contour line 140_1 of the CSS 140) may be equal to or less than 25 µm or 20 µm or 15 µm or 10 µm or 5 µm or 3 µm. The smaller D, the higher is the effect of the intrinsic tensile stress on the inducement of compressive stress at the periphery 100A of the semiconductor chip 100.

Figure 2:
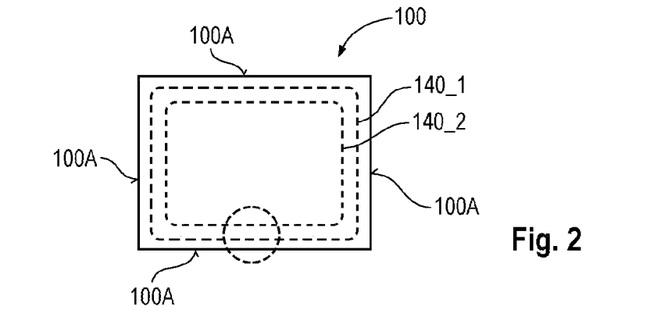
FIG. 2 is a schematic top view of the exemplary semiconductor chip of FIG. 1.

FIG. 2 illustrates that the CSS 140 is formed adjacent to the periphery 100A of the semiconductor chip 100 and encompasses the active area AA of the semiconductor chip 100 along all side faces of the semiconductor chip 100. The CSS 140, as defined by the outer and inner circumferential contour lines 140_1, 140_2, may have a rounded shape at the corners of the semiconductor chip 100. This rounded design is beneficial to avoid corner chip cracking (see FIG. 4A).

Figure 3A:
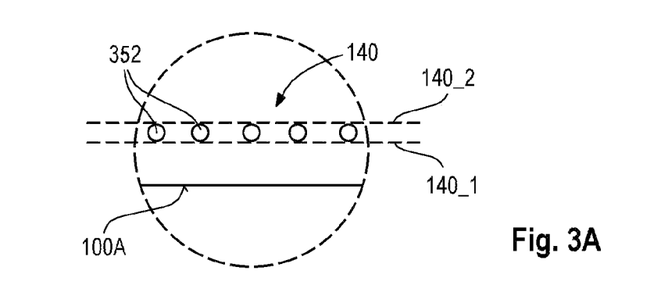
FIGS. 3A-3G are views of an enlarged detail of FIG. 2 according to several design examples of CSS.

The CSS 140 may be implemented in a variety of recess geometries. FIGS. 3A-3G illustrate exemplary recess geometries. Referring to FIG. 3A, an exemplary CSS 140 may be designed as a row of holes 352. That is, each recess 150 is formed by an individual hole 352. The shape of the holes 352 may be similar to needles. The distance between sidewalls of adjacent holes 352 may, e.g., be equal to or less than 5 µm or 3 µm or 1 µm or 0.5 µm. The outer and inner circumferential contour lines 140_1, 140_2 are here tangential to the sidewalls of the holes 352.

Figure 3B:
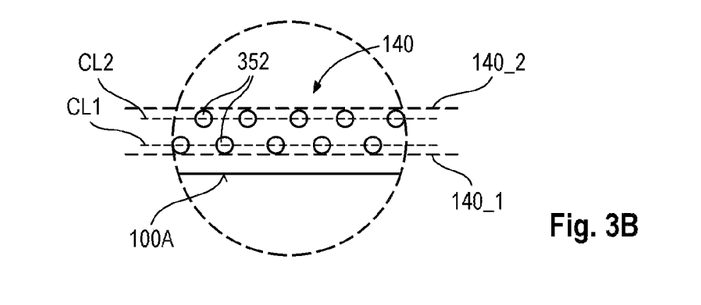

Referring to FIG. 3B, the CSS 140 may comprise a plurality (here e.g. 2) of rows of recesses. In FIG. 3B the recesses are, e.g., again formed by holes 352. A distance between a first row of holes 352 and a second row of holes 352 may, e.g., be equal to or less than 7 µm or 5 µm or 3 µm or 1.5 µm as measured between a center line CL1 of the first row of holes and a center line CL2 of the second row of holes 352.

Further, the holes 352 of the first and second rows may be arranged in interdigitated pattern such that a hole 352 of the first row is opposite to a space between two holes 352 of the second row and vice versa. Such interdigitated hole pattern impedes the formation and/or growth of vertical chip cracks if compared to a non-interdigitated hole pattern.

Figure 3C:
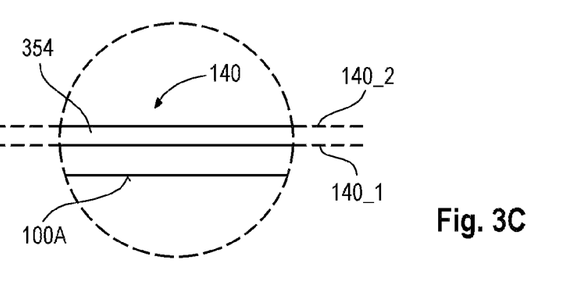
Figure 3D:
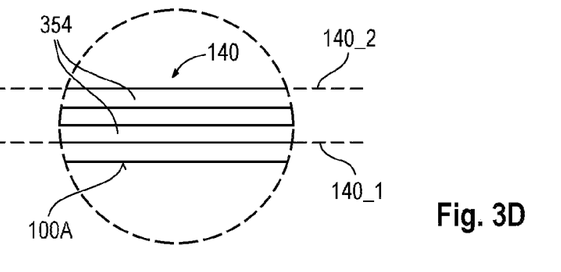

Referring to FIG. 3C, the CSS 140 may be formed by a circumferential closed-loop trench 354. In this case the CSS 140 may be formed by a single recess. Multiple trenches 354, as illustrated in FIG. 3D, are also feasible. In these cases, the outer and inner circumferential contour lines 140_1, 140_2 fall together with the sidewalls of the trench(es) 354.

Figure 3E:
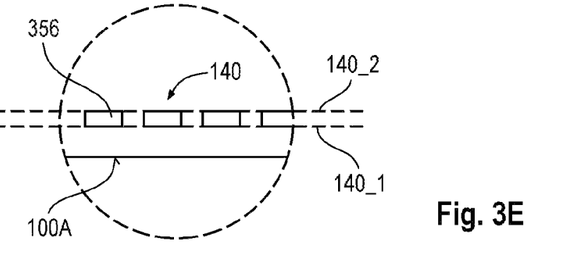
Figure 3F:
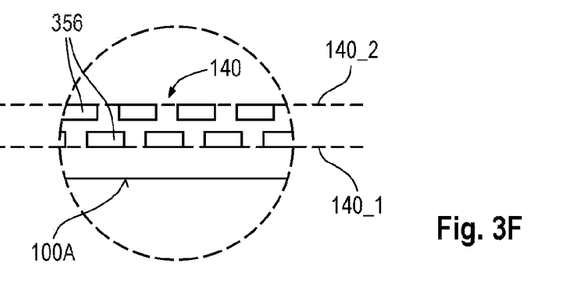

Referring to FIGS. 3E and 3F, a CSS geometry may be based on recesses shaped as slits 356. Such Slits 356 may be arranged in analogous pattern as already described in conjunction with FIGS. 3A and 3B, and reference is made to the above description in order to avoid reiteration.

Figure 3G:
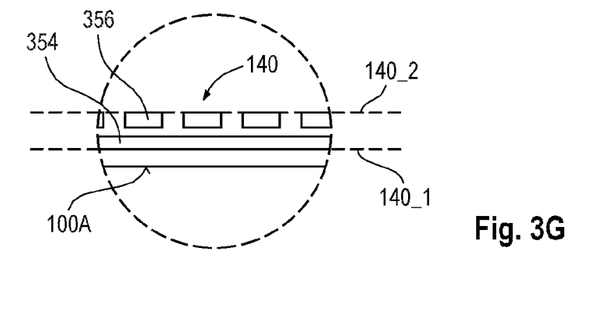

FIG. 3G illustrates a "mixed" design in which an outer recess of the CSS 140 is formed by a continuous trench 354 and an inner part of the CSS 140 is formed by a row of slits 356 (or, e.g., vice versa). Other "mixed" design options are row(s) of holes 352 combined with one or more trenches 354 and/or row(s) of slits 356.

Figure 4A:
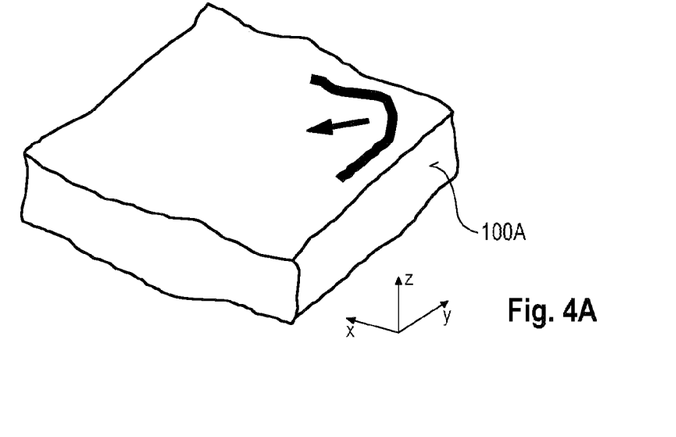
FIG. 4A is a schematic perspective view of a corner chip crack type and the compressive pre-stress at the corner effective to counteract the formation of corner chip crack.
Figure 4B:
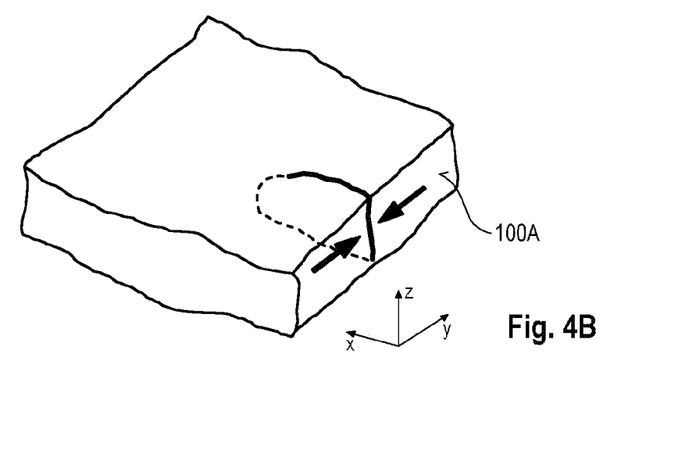
FIG. 4B is a schematic perspective view of a vertical chip crack type and the compressive pre-stress at the chip wall effective to counteract the formation of vertical chip crack.
Figure 4C:
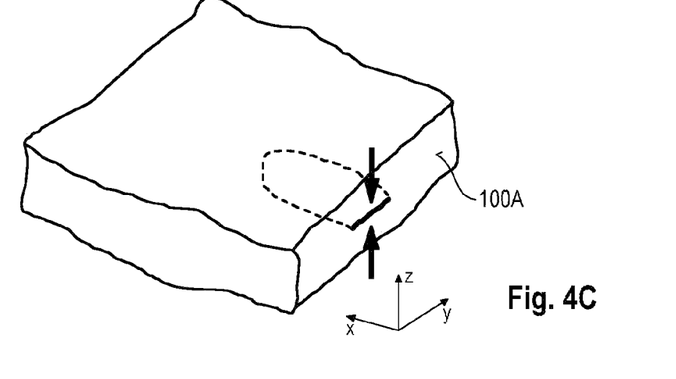
FIG. 4C is a schematic perspective view of a horizontal chip crack type and the compressive pre-stress at the chip wall effective to counteract the formation of horizontal chip crack.

FIGS. 4A-4C illustrate different types of chip cracks together with the direction of compressive stress used to counteract the formation and/or propagation of such cracks. Referring to FIG. 4A, corner chip cracks are known to occur nearby chip corners. A rounded progression of the CSS 140 in the vicinity of a chip corner impedes this type of cracking failure, because a smooth rounding of the CSS 140 at the chip corner will induce additional compressive force in the direction of the arrow.

FIG. 4B illustrates a vertical chip crack scenario. In this case the compressive stress must be induced in a direction parallel to the semiconductor chip surface (see arrows). In contrast, in a horizontal chip crack scenario as depicted in FIG. 4C, the compressive stress needs to be induced in a direction orthogonal to the semiconductor chip surface (see arrows). Both pre-stresses (FIG. 4B and FIG. 4C) should act along largest possible height (Z-axis) and length (X-axis, Y-axis), because the position of crack initiation is a-priori unknown.

FIGS. 5A to 7B illustrate computational simulation results of the stress induced in a semiconductor chip 100 and at the periphery 100A thereof for various CSS geometries. In all simulations the semiconductor chip material was Si and the material of the CSS was tungsten. The intrinsic tensile stress at room temperature of the tungsten material in the recess(es) was set to 500 MPa. All values indicated in the FIGS. 5A to 7B are in units of MPa.

Figure 5A:
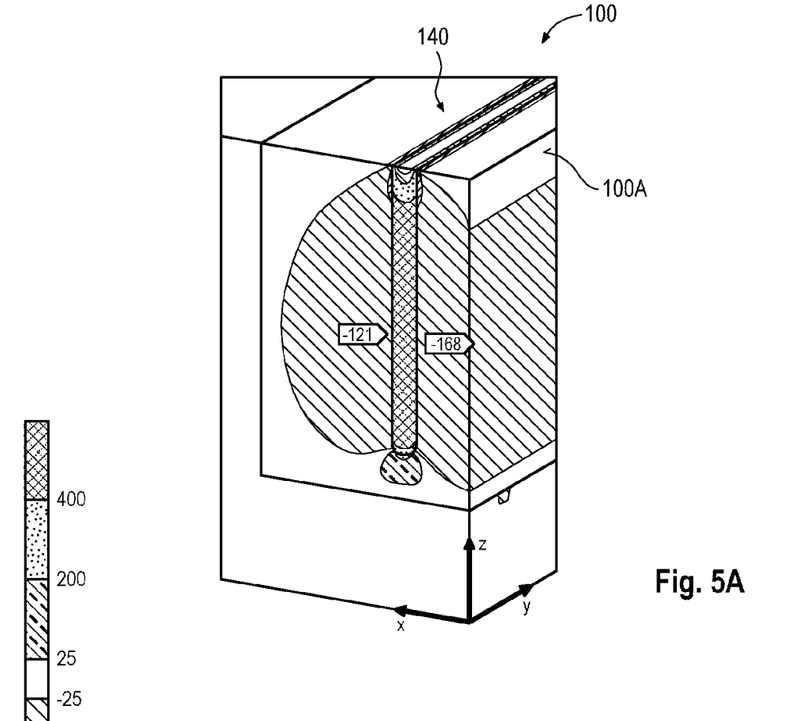
FIG. 5A is a partial semi-sectional perspective view of a peripheral region of the chip illustrating an exemplary single trench type CSS and simulation results of the compressive stress Szz in the Z-Z direction (counteracting horizontal chip crack) induced by the CSS.

FIG. 5A illustrates a single trench type CSS 140. The depth of the trench was 39 μm and the distance from the wall of the trench to the sidewall (periphery 100A) of the semiconductor chip 100 was 8 μm. FIG. 5A illustrates that a relatively high compressive stress $S_{zz}$=−168 MPa in the Z-Z direction was induced to effectively counteract horizontal chip cracking.

Figure 5B:
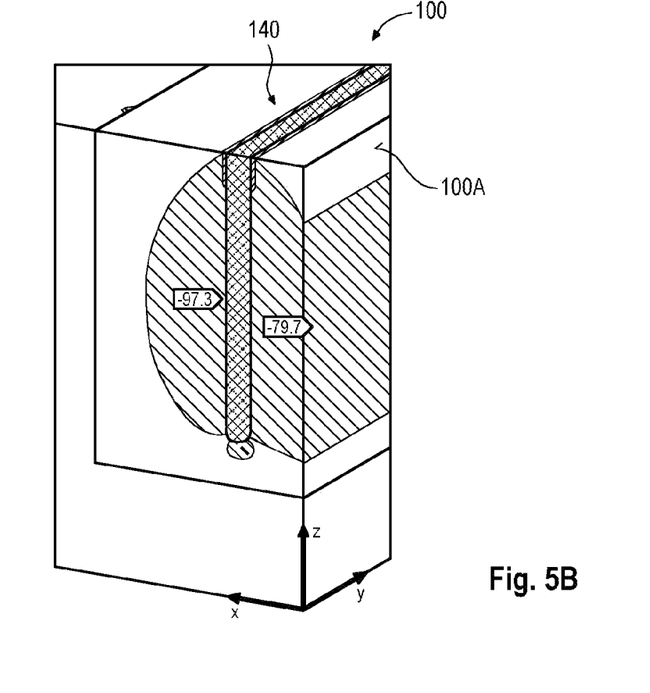
FIG. 5B is a partial semi-sectional perspective view of a peripheral region of the chip illustrating an exemplary single trench type CSS and simulation results of the compressive stress Syy in the Y-Y direction (counteracting vertical chip crack) induced by the CSS.

FIG. 5B illustrates that compressive stress of about $S_{yy}$=−79.7 MPa in the Y-Y direction was induced at the periphery 100A of the semiconductor chip 100 to counteract vertical chip cracking.

Figure 6A:
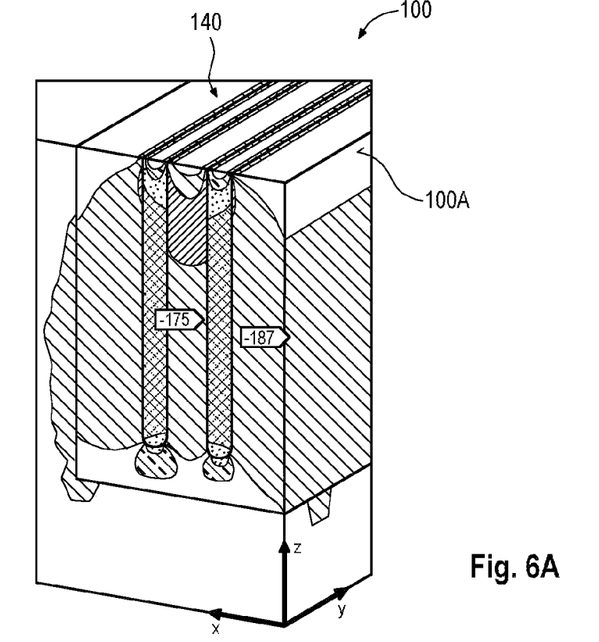
FIG. 6A is a partial semi-sectional perspective view of a peripheral region of the chip illustrating an exemplary dual trench type CSS and simulation results of the compressive stress Szz in the Z-Z direction (counteracting horizontal chip crack) induced by the CSS.
Figure 6B:
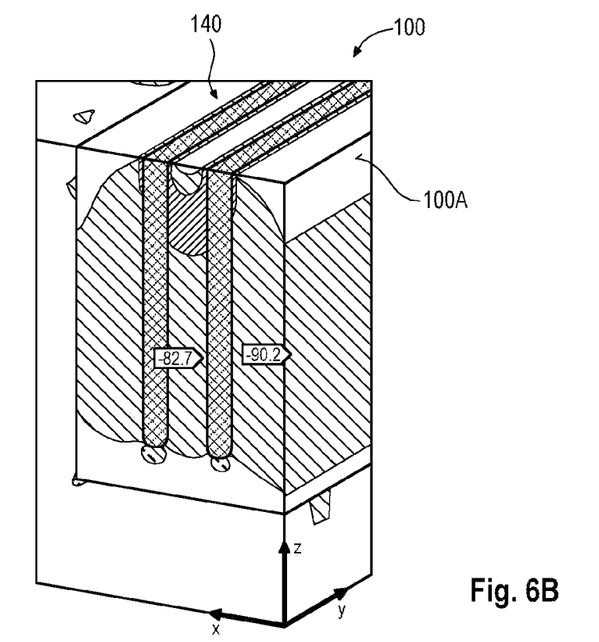
FIG. 6B is a partial semi-sectional perspective view of a peripheral region of the chip illustrating an exemplary dual trench type CSS and simulation results of the compressive stress Syy in the Y-Y direction (counteracting vertical chip crack) induced by the CSS.

FIGS. 6A and 6B illustrate computational simulation results of Szz and Syy within the semiconductor chip 100 and at the periphery 100A thereof obtained for a dual trench type CSS 140. The thickness of Si between the two trenches was 5.5 μm and the pitch of the trenches (as measured between the center lines thereof) was 9 μm. Again, a depth of 39 μm of the trenches was used for simulation.

FIG. 6A illustrates the inducement of a compressive stress in Z-Z direction of about $S_{zz}$=−187 MPa at the periphery 100A of the semiconductor chip 100. Such relatively high compressive stress effectively counteracts the formation of horizontal chip cracks. Referring to FIG. 6B, a compressive stress of $S_{yy}$=−90.2 MPa was obtained at the periphery 100A of the semiconductor chip 100 in the Y-Y direction, i.e. in the direction effective to counteract vertical chip cracking.

Comparing the values of the induced compressive stress by the single trench type recess and the dual trench type recess, it appears that an additional trench enhances the amount of compressive stress both in the Z-Z direction and in the Y-Y direction showing up at the periphery 100A (i.e. the sidewall) of the semiconductor chip 100. On the other hand, it appears that the single trench geometry is already rather effective in generating a sufficient amount of compressive stress at the periphery 100A of the semiconductor chip 100.

Figure 7A:
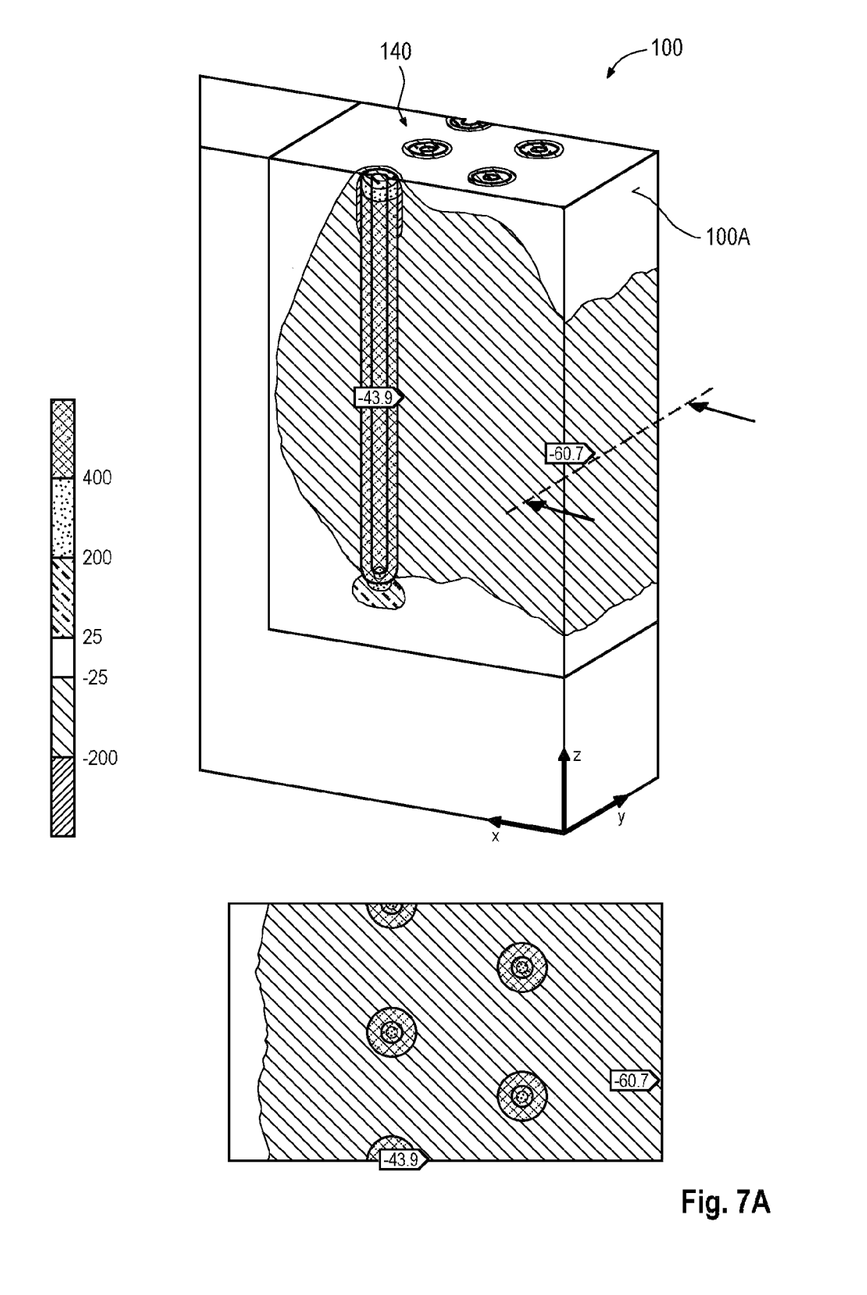
FIG. 7A is a partial semi-sectional perspective view of a peripheral region of the chip illustrating an exemplary dual hole row type CSS and simulation results of the compressive stress Szz in the Z-Z direction (counteracting horizontal chip crack) induced by the CSS.

FIG. 7A illustrates the compressive stress in the Z-Z direction induced at the periphery 100A of the semiconductor chip 100 by a dual row hole type (i.e. needle type) CSS 140. Again, the depth of the holes (needles) is 39 μm and the Si thickness between adjacent sidewalls of the holes in each row is 5.5 μm. As can be seen from FIG. 7A, a compressive stress $S_{zz}$=−60.7 MPa is induced at the periphery 100A of the semiconductor chip 100. This compressive stress effectively counteracts the formation of horizontal chip cracks.

The bottom part of FIG. 7A illustrated the simulation results of Szz in a sectional view representation (sectional line is illustrated in the upper part of FIG. 7A). It is apparent that the entire region around the holes and in particular the entire periphery 100A of the semiconductor chip 100 along the sectional line (which is oriented in Y direction) is forced into a compressively pre-stressed state.

Figure 7B:
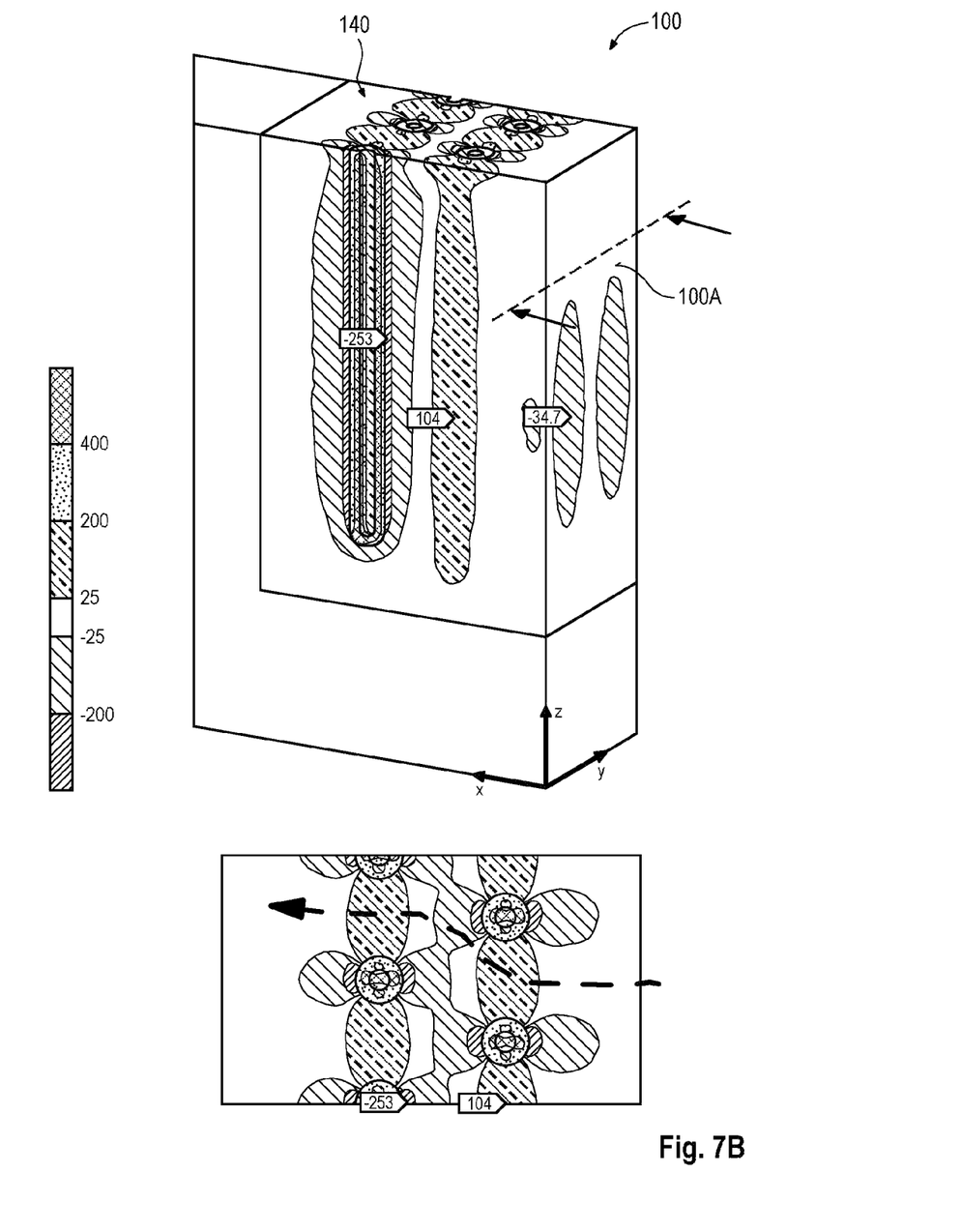
FIG. 7B is a partial semi-sectional perspective view of a peripheral region of the chip illustrating an exemplary dual hole row type CSS and simulation results of the compressive stress Syy in the Y-Y direction (counteracting vertical chip crack) induced by the CSS.

FIG. 7B illustrates the inducement of compressive stress in the Y-Y direction at the periphery 100A of the semiconductor chip 100. In this example, separate areas of compressive stress $S_{yy}$=−34.7 MPa are induced at the periphery 100A. These areas align with the geometry of the outer CSS needles and apparently do not provide for a perfect protection against vertical chip crack occurrence and/or propagation. It is expected that the protection against vertical chip crack protection could be improved by reducing the distance of the holes to the periphery 100A of the semiconductor chip 100 to values significantly below 10 μm (e.g. below 8 μm, 6 μm, etc.) and/or by reducing the Si thickness between adjacent holes in at least the outer row of holes to values significantly below 5.5 μm (e.g. equal to or less than 4, 3, 2, 1 μm).

A possible propagation path of a vertical chip crack through the dual row hole type CSS 140 of FIG. 7B is illustrated by the dashed arrow at the bottom of FIG. 7B showing the simulation results of Syy in a sectional view representation (sectional line is illustrated in the upper part of FIG. 7B).

Further, it has been found that by reducing the distance between the outer circumferential contour line 140_1 defined by the (outermost) trench or row of holes or slits (see FIGS. 1 to 3G) and the periphery 100A of the semiconductor chip 100 from e.g. 10 μm to 8 μm or even below increases the compressive stress induced at the periphery 100A of the semiconductor chip 100. Therefore, the CSS 140 may advantageously be built very compact within, e.g., a 10 μm or 15 μm edge zone EZ of dimension E (see FIG. 1). Quite in contrast, the distance between the chip periphery 100A and the electrical active area AA (i.e. the distance E in FIG. 1) is about 45 μm in conventional semiconductor chips. Hence, the pre-stressing CSS 140 disclosed herein allow to significantly increase the usage of wafer area.

As mentioned above, the metal filling the one or more recesses needs to have an intrinsic tensile stress at room temperature high enough to induce compressive stress in at least a region of the periphery of the semiconductor chip. To this end, the metal is deposited in the recess by using deposition or filling processes which allow to achieve the required intrinsic tensile stress in the metal. It is known in the art that the intrinsic tensile stress of metal deposited on a semiconductor strongly depends on the deposition parameters used during the metal deposition process. More specifically, about 80% of the intrinsic tensile stress at room temperature of a metal deposited in a recess is governed by the parameters of the deposition process, while only about 20% of the intrinsic tensile stress is due to the metal's thermal behavior, e.g. the CTE (coefficient of thermal expansion) mismatch.

Figure 8:
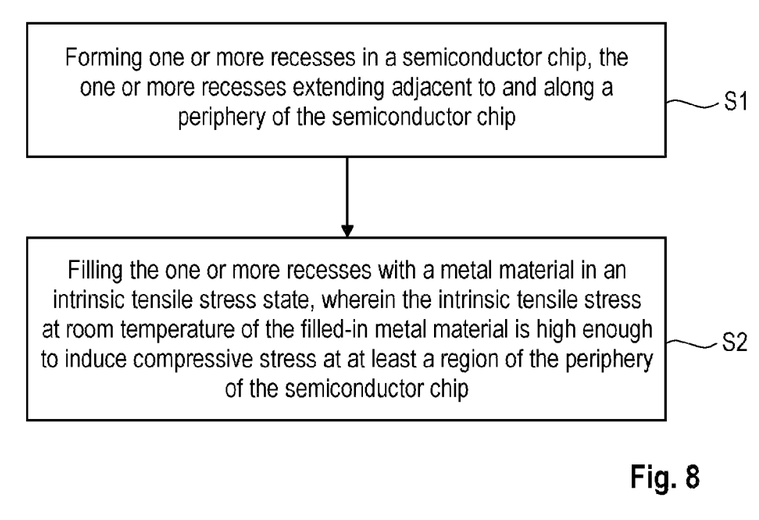
FIG. 8 is a flowchart illustrating stages of an exemplary method of manufacturing a semiconductor chip having a CSS.

Referring to FIG. 8, a method of manufacturing a semiconductor chip having a CSS comprises, at S1, forming one or more recesses in the semiconductor chip, the one or more recesses extending adjacent to and along a periphery of the semiconductor chip. Any methods such as, e.g. lithography and etching may be used for recess formation.

At S2 the one or more recesses are filled with a metal material in an intrinsic tensile stress state, wherein the intrinsic tensile stress at room temperature of the filled-in metal material is high enough to induce compressive stress in at least a region of the periphery of the semiconductor chip.

One possibility to provide for CSS pre-stressed metal is to use pulsed nucleation layer (PNL) techniques. PNL involves exposing the semiconductor chip with the one or more recesses formed therein to a plurality of sequences of reducing agents and a metal precursor process gas to grow a nucleation layer of the desired intrinsic tensile stress. More specifically, in a PNL process pulses of the reducing agent, purge gases and metal-containing precursor gas(es) are sequentially injected into and purged from the reaction chamber. The process is repeated in a cyclic fashion until the desired thickness of the metal layer in the recess is achieved or until the recess is completely filled.

It has been found that a complete PNL metal fill (i.e. a filling process which is different from a so-called via process in which a central region of the recess remains a void volume) may be preferred in terms of maximizing the intrinsic tensile strength of the filled-in metal. However, depending on the recess geometry, also partial filling can still be feasible in some cases, in particular for holes (but less for trenches).

Figure 9:
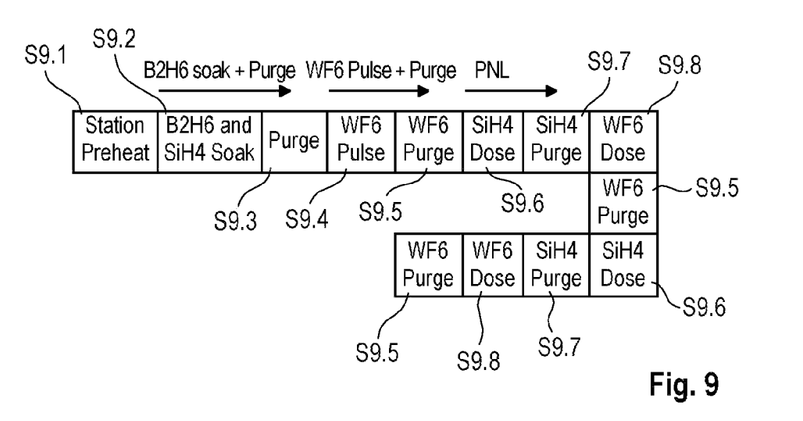
FIG. 9 is a diagram illustrating an exemplary sequence of process stages of a pulsed nucleation layer (PNL) chemical vapor deposition (CVD) process.

FIG. 9 illustrates a PNL process flow in which $WF_6$ is used as the metal precursor process gas. In this example a purge gas comprising $SiH_4$ and a reducing agent comprising a borane, here $B_2H_6$, are added. The process flow starts at S9.1, in which the process chamber and the semiconductor wafer accommodated therein are pre-heated. S9.2 and S9.3 involve initial $B_2H_6$ and $SiH_4$ soak and purge steps, respectively. At S9.4 a first $WF_6$ pulse is admitted and at S9.5 $WF_6$ purging is carried out. The characteristic part of the PNL process starts at S9.6, where a $SiH_4$ dose is admitted, followed by a $SiH_4$ purge at S9.7 and a $WF_6$ dose at S9.8. The sequence of S9.5 through S9.8 is then repeated a number of times until the desired metal layer thickness is obtained.

Figure 10:
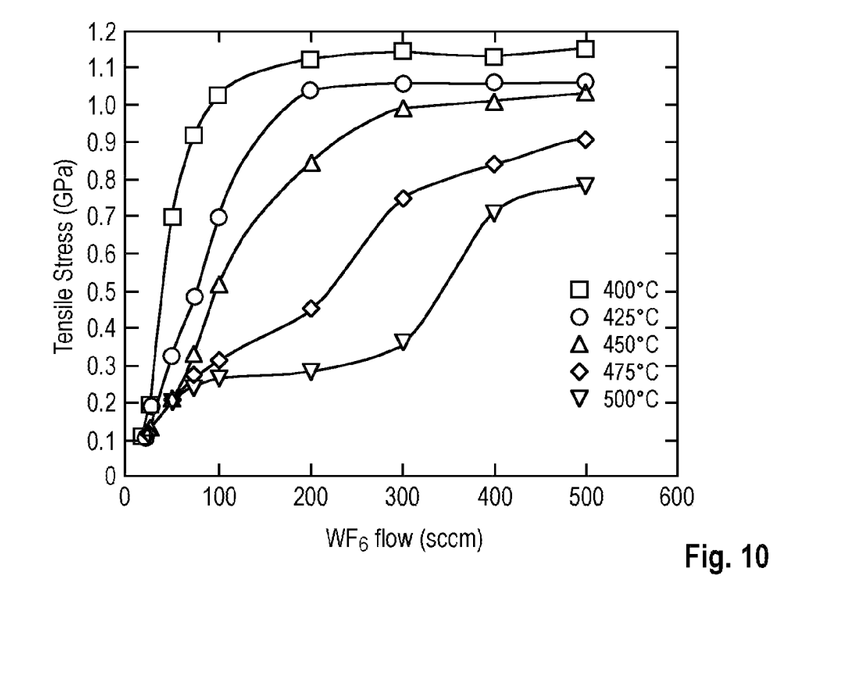
FIG. 10 is a diagram illustrating the intrinsic tensile stress of a tungsten film produced by CVD at different flow rates of the metal precursor process gas $WF_6$ for several deposition temperatures.
Figure 11:
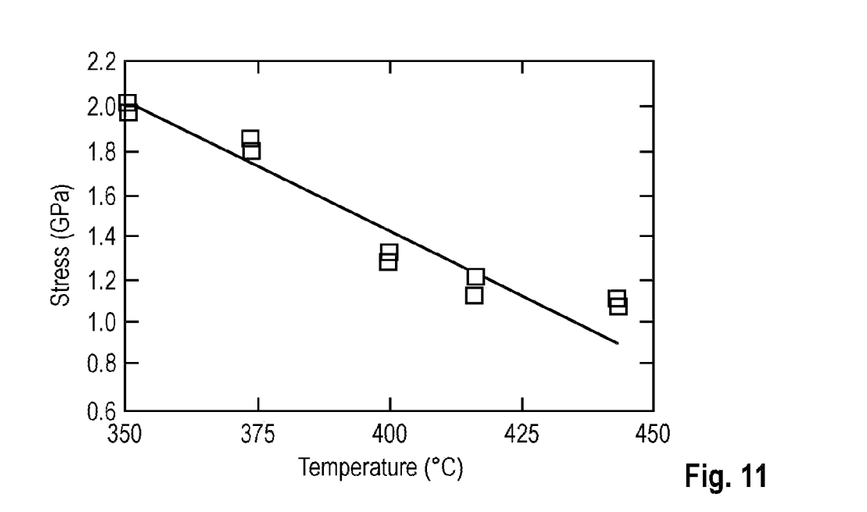
FIG. 11 is a diagram illustrating the intrinsic tensile stress of a tungsten film produced by CVD at different deposition temperatures.

FIGS. 10 and 11 illustrate by which deposition parameters the intrinsic tensile stress of the CSS metal (tungsten) can be set. Referring to FIG. 10, the X-axis of the diagram represents the $WF_6$ flow (in sccm) and the Y-axis represents the tensile stress (in GPa). The deposition process underlying the results of FIG. 10 is a CVD-PNL process for W film deposition. As apparent from FIG. 10, the lower the deposition temperature, the higher is the intrinsic tensile stress obtained in the W layer. For instance, the deposition temperature may be set to be equal to or less than 450° C. or 425° C. or 400° C. or 375° C. or 350° C.

Further, the metal precursor gas flow rate has a substantial effect on the obtained intrinsic tensile stress. The higher the $WF_6$ flow rate, the higher is the intrinsic tensile stress which can be achieved. For instance, the flow rate of the metal precursor process gas is equal to or greater than 200 sccm or 300 sccm or 400 sccm.

FIG. 11 illustrates the dependency of the intrinsic tensile stress of the deposited tungsten layer from the deposition temperature. The intrinsic tensile stress can be significantly increased by lowering the deposition temperature. This finding also holds for low deposition temperatures such as, e.g., below 400° C. or 375° C. or 350° C.

It is to be noted that physical vapor deposition (PVD) techniques may alternatively be used to provide for CSS metals of high intrinsic tensile stress. For instance, Ni or NiV films deposited by PVD using, e.g., Argon (Ar) as a process gas can be deposited under high intrinsic tensile stress conditions. The intrinsic tensile stress can be controlled by various process parameters during the PVD process. Deposition temperature, deposition pressure, RF bias and the type of process gas affect the intrinsic stress of the deposited metal. In particular, a pure Ar process gas undiluted by, e.g., $N_2$ allows to generate Ni or NiV metal layers with high intrinsic tensile stress equal to or greater than 1.0 GPa.

Further, it has been verified that the CSS of high intrinsic tensile stress nevertheless only induce a relatively small increase of mechanical stress ≤10 MPa inside the electrically active chip area AA (see FIG. 1). Hence, no adverse piezoelectric-like effects are expected in the electrically active chip area AA. Further, based on the simulation results, the pre-stressed CSS only causes a relatively small increase of chip bow of ≤1 μm. Therefore, no issues with die-attach and/or bonding (e.g. wire bonding) are expected to be caused by the pre-stressed CSS disclosed herein.

In summary, the concept of providing for a pre-stressed (tensile stress) CSS to induce a pre-stressed (compressive stress) periphery of the semiconductor chip allows to build a very compact CSS, thus increasing the usable wafer area and hence reducing manufacturing costs. For example, the dimension E of the edge zone EZ (see FIG. 1) may be reduced from conventional 45 μm to only 10 μm or even less by the pre-stressed CSS approach described herein.

Further, in view of packaging, the larger fracture strength of the semiconductor chip having a pre-stressed CSS as disclosed herein allows the usage of semiconductor chip packages with less expensive encapsulating materials, which will reduce semiconductor packaging manufacturing cost.

The following examples pertain to further aspects of the disclosure:

Example 1 is a semiconductor chip having a crack stop structure, the crack stop structure comprising one or more recesses formed in the semiconductor chip, the one or more recesses extending adjacent to and along a periphery of the semiconductor chip, wherein the one or more recesses are filled with a metal material, and the metal material has an intrinsic tensile stress at room temperature high enough to induce compressive stress in at least a region of the periphery of the semiconductor chip.

In Example 2, the subject matter of Example 1 can optionally include wherein the intrinsic tensile stress at room temperature is equal to or greater than 200 MPa or 300 MPa or 500 MPa or 700 MPa or 900 MPa or 1.0 GPa or 1.2 GPa or 1.5 GPa or 2.0 GPa or 2.5 GPa.

In Example 3, the subject matter of Example 1 or 2 can optionally include wherein the entire periphery of the semiconductor chip is biased in a compressive stress state induced by the crack stop structure.

In Example 4, the subject matter of any preceding Example can optionally include wherein the compressive stress at the region of the periphery or the entire periphery of the semiconductor chip is equal to or less than −25 MPa or −50 MPa or −75 MPa or −100 MPa or −200 MPa.

In Example 5, the subject matter of any preceding Example can optionally include wherein the metal material is of tungsten or tungsten titanium alloy or nickel or nickel vanadium alloy.

In Example 6, the subject matter of any preceding Example can optionally include wherein the metal material provides for a full material fill of the one or more recesses.

In Example 7, the subject matter of any preceding Example can optionally include wherein a distance between the periphery of the semiconductor chip and the crack stop structure is equal to or less than 25 μm or 20 μm or 15 μm or 10 μm or 5 μm or 3 μm.

In Example 8, the subject matter of any preceding Example can optionally include wherein the semiconductor chip comprises a semiconductor substrate and a layer stack of insulating layers and metal layers disposed over the semiconductor substrate, wherein at least some of the one or more recesses pass through the layer stack and extend into the substrate.

In Example 9, the subject matter of Example 8 can optionally include wherein at least some of the one or more recesses pass through the substrate.

In Example 10, the subject matter of any preceding Example can optionally include wherein the crack stop structure comprises one or more recesses which are formed as circumferential trenches.

In Example 11, the subject matter of any preceding Example can optionally include wherein the crack stop structure comprises one or more rows of recesses, wherein the recesses are formed as holes.

In Example 12, the subject matter of Example 11 can optionally include wherein the crack stop structure comprises a first and a second row of holes and a distance between the first and second rows of holes is equal or less than 7 μm or 5 μm or 3 μm or 1.5 μm.

In Example 13, the subject matter of Example 12 can optionally include wherein the holes of the first and second rows are arranged in an interdigitated pattern such that a hole of the first row is opposite to a space between two holes of the second row and vice versa.

Example 14 is a method of manufacturing a semiconductor chip having a crack stop structure, the method comprising: forming one or more recesses in the semiconductor chip, the one or more recesses extending adjacent to and along a periphery of the semiconductor chip; and filling the one or more recesses with a metal material in an intrinsic tensile stress state, wherein the intrinsic tensile stress at room temperature of the filled-in metal material is high enough to induce compressive stress in at least a region of the periphery of the semiconductor chip.

In Example 15, the subject matter of Example 14 can optionally include wherein filling is carried out by chemical vapor deposition, and the deposition temperature is equal to or less than 450° C. or 425° C. or 400° C. or 375° C.

In Example 16, the subject matter of Example 15 can optionally include wherein a flow rate of a metal precursor process gas is equal to or greater than 200 sccm or 300 sccm or 400 sccm.

In Example 17, the subject matter of Example 15 or 16 can optionally include wherein chemical vapor deposition is carried out by using a series of alternating pulses of a metal precursor process gas and a purge gas.

In Example 18, the subject matter of Example 17 can optionally include wherein the metal precursor process gas comprises $WF_6$, the purge gas comprises $SiH_4$ and a borane is added as a reducing agent.

In Example 19, the subject matter of Example 14 can optionally include wherein filling is carried out by physical vapor deposition.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor chip comprising a crack stop structure, the crack stop structure comprising one or more recesses formed in the semiconductor chip, the one or more recesses extending adjacent to and along a periphery of the semiconductor chip, wherein:
   the one or more recesses are filled with a metal material;
   the metal material has an intrinsic tensile stress at room temperature to induce compressive stress in at least a region of the periphery of the semiconductor chip; and
   a distance between the periphery of the semiconductor chip and the crack stop structure is equal to or less than 25 μm.

2. The semiconductor chip of claim 1, wherein the intrinsic tensile stress at room temperature is equal to or greater than 200 MPa.

3. The semiconductor chip of claim 1, wherein an entirety of the periphery of the semiconductor chip is biased in a state of the compressive stress induced by the crack stop structure.

4. The semiconductor chip of claim 1, wherein the compressive stress at the region of the periphery or an entirety of the periphery of the semiconductor chip is equal to or less than −25 MPa.

5. The semiconductor chip of claim 1, wherein the metal material comprises tungsten or tungsten titanium alloy or nickel or nickel vanadium alloy.

6. The semiconductor chip of claim 1, wherein the metal material provides for a full material fill of the one or more recesses.

7. The semiconductor chip of claim 1, wherein the semiconductor chip comprises a semiconductor substrate and a layer stack of insulating layers and metal layers disposed over the semiconductor substrate, and wherein at least some of the one or more recesses pass through the layer stack and extend into the substrate.

8. The semiconductor chip of claim 7, wherein the at least some of the one or more recesses pass through the substrate.

9. The semiconductor chip of claim 1, wherein the one or more recesses are formed as circumferential trenches.

10. The semiconductor chip of claim 1, wherein the one or more recesses are formed as holes.

11. The semiconductor chip of claim 10, wherein the holes are arranged as a first row and a second row of holes, and wherein a distance between the first row and the second row of holes is equal or less than 7 μm.

12. The semiconductor chip of claim 11, wherein the holes of the first row and the second row are arranged in an interdigitated pattern such that a hole of the first row is opposite to a space between two holes of the second row and vice-versa.

13. A semiconductor chip comprising a crack stop structure, the crack stop structure comprising one or more recesses formed in the semiconductor chip, the one or more recesses extending adjacent to and along a periphery of the semiconductor chip, wherein:
   the one or more recesses are filled with a metal material;
   the metal material has an intrinsic tensile stress at room temperature to induce compressive stress in at least a region of the periphery of the semiconductor chip;
   the crack stop structure is located outside an electrically active area of the semiconductor chip in an edge zone of the semiconductor chip; and
   a distance between the periphery and the electrically active area is 15 μm or less.

* * * * *